June 1, 1965 B. STEFANOV 3,187,195

FREQUENCY DIFFERENCE MEASURING CIRCUIT

Filed Jan. 16, 1961

2 Sheets-Sheet 1

INVENTOR.
BORIS STEFANOV
BY Elliott & Pastoriza
ATTORNEYS

INVENTOR.
BORIS STEFANOV
BY Elliott & Pastoriza
ATTORNEYS

United States Patent Office 3,187,195
Patented June 1, 1965

3,187,195
FREQUENCY DIFFERENCE MEASURING CIRCUIT
Boris Stefanov, Los Angeles, Calif., assignor to Kauke and Company, Inc., a corporation of California
Filed Jan. 16, 1961, Ser. No. 82,971
2 Claims. (Cl. 307—88.5)

This invention relates generally to electrical circuits and more particularly to novel circuits for providing an output wave form having a frequency equal to the difference frequency of first and second input wave forms.

Circuits for generating frequency differences are well known in the art. Certain types of such circuits such as employed in radio circuitry, for example, are often referred to as "mixers." In addition to a frequency difference output signal, however, mixer circuits will also include in the output signal additional wave forms corresponding to the original input signals as well as the frequency sum of the input signals. As a consequence, if only the difference frequency signal is desired, suitable filters must be employed.

In addition to the foregoing, presently known mixer circuits will not provide a difference frequency if the actual difference in the frequency between the input signals is relatively small; for example, of the order of one cycle per second. This is because the output circuit components of the mixers are designed to pass only certain frequency ranges and when frequencies approach relatively low values, they appear essentially as direct currents and thus are blocked by the output components designed only to pass A.-C.

With the above in mind, it is a primary object of this invention to provide novel difference frequency generating circuits in which the output wave form consists solely of a signal having a frequency corresponding to the difference in frequency of first and second input wave forms.

More particularly, it is an object to provide novel frequency difference generating circuits in which the output wave form may have a frequency from zero to a value corresponding to the higher frequency input wave form signal to the end that there is thus provided a circuit means for providing a signal which may be varied in frequency from zero cycles per second slowly up through various frequencies to the frequency of the higher frequency input signal when the other input signal is of zero frequency.

More general objects of this invention are to provide novel frequency difference generating circuits meeting the foregoing objects which employ minimum numbers of components so that their life and reliability are high and so that they may be manufactured relatively economically.

Briefly, these and other objects and advantages of this invention are attained by providing a converting means for receiving first and second input wave forms of different frequency and converting them into a time modulated signal in which the time modulation is determined by the relative lengths of time that the input signals are of like polarity as compared to the relative lengths of time that the signals are of unlike polarity. The time modulated signal, in turn, is then fed into an integrating means to provide an output wave form which will have a frequency corresponding to the difference in frequency of the input signals.

A better understanding of the invention will be had by referring to two embodiments thereof as illustrated in the accompanying drawings, in which.

Figure 1:
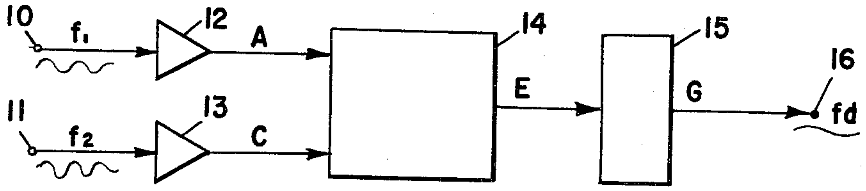
FIGURE 1 is a simplified block diagram of the basic circuit of the invention.
Figure 3:
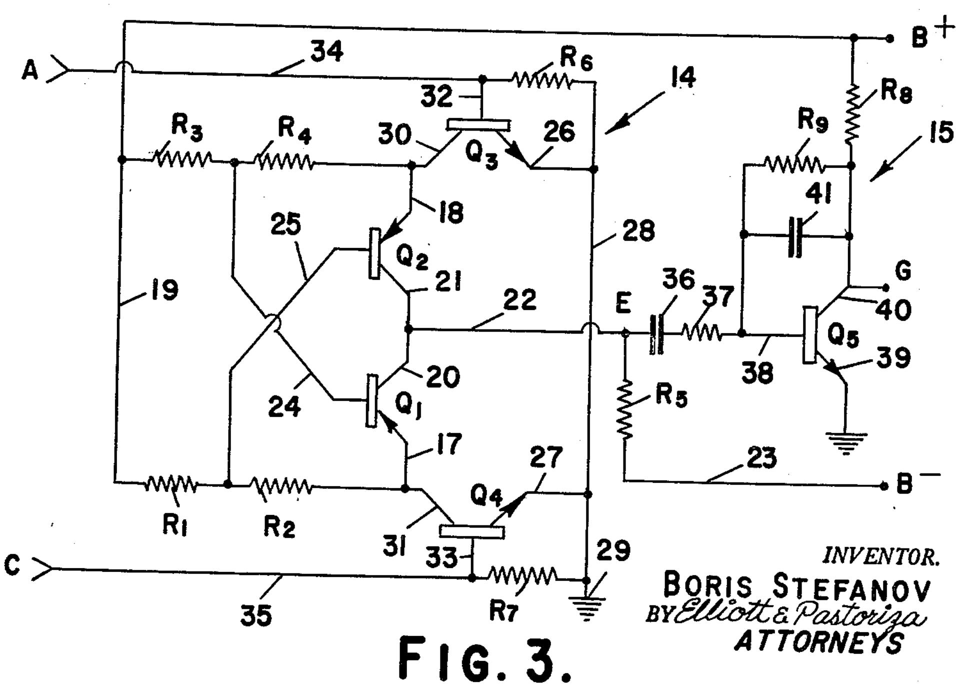
FIGURE 3 is a detailed circuit diagram of the first embodiment represented by certain ones of the blocks in the diagram of FIGURE 1.

Referring first to FIGURE 1, the circuit includes first and second inputs 10 and 11 for receiving first and second input wave forms having frequencies $f_1$ and $f_2$, respectively. As shown, these first and second input frequencies are fed through suitable square wave generating means which may constitute overdriven amplifiers 12 and 13, respectively. The resulting first and second square wave forms are fed into a converting means 14. As will become clearer when the exemplary detailed circuit of FIGURE 3 is described, the converting means 14 provides a time modulated output signal which changes between first and second voltages. Thus, a first voltage is provided at the output of the converting means 14 only when the first and second input square wave forms are of like polarity and the second output voltage is provided when the first and second input square wave forms are of unlike polarity.

These first and second voltages making up the time modulated signal are passed to an integrating means 15 to provide an output wave form at 16 having a frequency $f_d$ corresponding to the difference of the frequencies $f_1$ and $f_2$.

Figure 2:
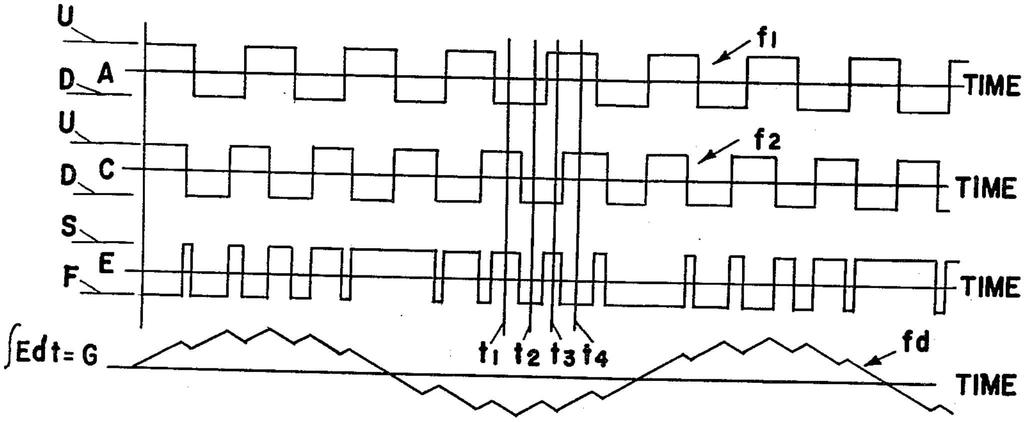
FIGURE 2 illustrates a series of wave forms occurring at correspondingly lettered points in the circuit of FIGURE 1 in accordance with a first embodiment of the invention.

The above will be clearer by now referring to the various wave forms shown in FIGURE 2. These wave forms are lettered A, C, E, and G and correspond to the wave forms appearing at the correspondingly lettered points A, C, E, and G in the block diagram of FIGURE 1. Thus, referring to the top wave form A, this wave form constitutes a square wave function having a frequency $f_1$ as would appear at the output of the overdriven amplifier 12 of FIGURE 1. Similarly, the wave form C constitutes a square wave function having a frequency $f_2$ corresponding to the square wave form at the output of the overdriven amplifier 13 of FIGURE 1. In the example chosen for illustrative purposes, it will be noted that the square wave form C has a slightly higher frequency $f_2$ than the frequency of the wave form A designated $f_1$. Therefore, it will be evident that by comparing the wave forms A and C at corresponding intervals of time, there will be periods when both wave forms have the same polarity such as the case when both are up or of positive polarity as indicated by the levels U to the left of the diagrams or when both are down or of negative polarity as indicated by the letters D to the left of the diagram. Also, there will be other periods when the wave form A is up and the wave form C is down and still other periods when the wave form C is up and the wave form A is down. Essentially, the converting means 14 of FIGURE 1 provides first and second output voltages which are determined by the polarity relationships of the wave forms A and C at given intervals of time.

Thus, referring to the wave form E, there is shown a first voltage level designated F to the left of the diagram in FIGURE 2 and a second voltage level indicated at S to the left of the diagram. The E wave form is up or at its second voltage level whenever the wave forms A and C are of opposite polarity such as indicated at the times $t_1$ and $t_3$ in FIGURE 2. The wave form E, on the other hand, is down or at its first voltage level S whenever the wave forms A and C are of the same polarity such as indicated at the times $t_2$ and $t_4$ in FIGURE 2.

Integration of wave form E from converter 14 by integrating means 15 of FIGURE 1 will then provide an output wave form as shown at G in FIGURE 2. This output wave form represents essentially the integral of the E wave form with respect to time, and it will be immediately evident that the frequency $f_d$ of the output wave form G corresponds to the difference frequency of the input wave forms or $f_2-f_1$.

FIGURE 3 illustrates one type of converting circuit for providing the wave form E in response to reception of the input square wave forms A and C. Also shown in FIGURE 3 is one type of integrating circuit.

Referring first to the converting circuit designated generally by the numeral 14 in FIGURE 3, there are provided first and second switching means in the form of PNP transistors $Q_1$ and $Q_2$. As shown, these transistors respectively include emitter terminals 17 and 18 connected through pairs of series connected resistances $R_1$, $R_2$ and $R_3$, $R_4$, respectively, to a common source of voltage $B^+$ supplied on line 19. When considered as switches, the emitters 17 and 18 may be considered as input means. The outputs are provided by the collector terminals 20 and 21 connected together to a common output lead 22 connecting to a junction point corresponding in position to the letter E from which an output load resistance $R_5$ is connected. As shown, the other side of the resistance $R_5$ is connected by lead 23 to the minus side of the voltage source designated $B^-$.

The switching transistors $Q_1$ and $Q_2$ in turn are controlled through their base terminal connections as indicated at 24 and 25. As shown, the base terminal 24 for the first transistor $Q_1$ connects to the junction point between resistances $R_3$ and $R_4$ and the base terminal 25 for the second transistor $Q_2$ connects to the junction point of the resistances $R_1$ and $R_2$. The actual control of the switching of the transistors $Q_1$ and $Q_2$ is effected by means of first and second control transistors $Q_3$ and $Q_4$ which are of the NPN type. As shown, these transistors have their respective emitter terminals 26 and 27 connected to a common lead 28 grounded at 29. Their collector terminals 30 and 31, in turn, are connected to the voltage source $B^+$ on line 19 through the series pairs of resistances $R_3$, $R_4$ and $R_1$, $R_2$ respectively. The base terminals 32 and 33 are respectively connected to receive the first and second square wave forms A and C on lines 34 and 35. Base resistances $R_6$ and $R_7$ connect between the lines 34 and 35 and common ground lead 28, respectively.

With the above described circuit, there will be provided at the junction point E a time modulated signal corresponding to the wave form E of FIGURE 2 when the first and second input wave forms A and C are provided on the conductors 34 and 35, respectively. The operation is as follows: With reference once again to FIGURE 2, assume conditions correspond to the time $t_1$. At this moment the input wave form A is down and the input wave form C is up. Referring to FIGURE 3, the input wave form A on line 34 will drive the base terminal 32 of the transistor $Q_3$ negative holding the transistor $Q_3$ off or nonconducting. Simultaneously, reception of the up input wave form C on the base terminal 33 of the transistor $Q_4$ will switch this transistor to a conducting state. Current will pass from $B^+$ through the lead 19, $R_1$, $R_2$, collector terminal 31, transistor $Q_4$, emitter terminal 27, and to ground at 29. The flow of current through the resistances $R_1$ and $R_2$ will result in a drop of potential at the junction point between these resistances, thereby driving the base terminal 25 of the second switching transistor $Q_2$ negative to turn on this transistor. Since the control transistor $Q_3$ is not conducting, the voltage at the junction point of the resistances $R_3$ and $R_4$ will remain high, and therefore the voltage on the base terminal 24 for the switching transistor $Q_1$ will remain elevated and switching transistor $Q_1$ will be held off or open. With transistor $Q_2$ conducting, current will pass from $B^+$ and lead 19 through the resistances $R_3$ and $R_4$, emitter terminal 18, collector terminal 21, and common output lead 22 to the junction point E to provide the second given voltage level shown at S at the time $t_1$ in FIGURE 2 for the wave form E. This second voltage level F is established as a result of the voltage drop across the load resistance $R_5$.

Considering now the time $t_2$ in FIGURE 2, it will be noted that the input wave form A is still down but that the input wave form C has changed from up to down. With reference to FIGURE 3, when the voltage on the line 35 changes from up to down, the base terminal 33 is dropped in voltage, thereby turning off the previously conducting transistor $Q_4$. With transistor $Q_4$ cut off, current flow will stop through the resistances $R_1$ and $R_2$ and therefore their junction point will rise in potential, thereby elevating the potential on the base terminal 25 to switch off the transistor $Q_2$. The transistor $Q_3$ will remain nonconducting since the wave form A at the time $t_2$ is still down. Therefore, there will be no current flowing through the common output line 22 at the junction point E through the resistance $R_5$, and therefore the voltage at the junction point will be at the depressed or first lower voltage level as a consequence of the connection of this point through the resistance $R_5$ to the negative side $B^-$ of the voltage source. This first voltage level is indicated at F at the time $t_2$ in the wave form E of FIGURE 2.

At the time $t_3$, the wave form A has moved from down to up, and the wave form C is still down. Thus, with reference again to FIGURE 3, when the wave form A is up, the control transistor $Q_3$ will be switched on, resulting in current flowing through the resistances $R_3$ and $R_4$ and through the transistor $Q_3$ to the ground lead 28, thereby causing a drop in voltage at the junction point between the resistances $R_3$ and $R_4$. This drop in voltage will be passed to the base terminal 24 of the first switching transistor $Q_1$, thereby switching this transistor on. Current will thus pass through the resistances $R_1$ and $R_2$, transistor $Q_1$, common lead 22, to the junction E and across resistance $R_5$ to again provide a second voltage level at the junction point E. At this time $t_3$ since the second input wave form C is still down, the transistor $Q_4$ is held off and therefore the voltage at the junction of the resistances $R_1$ and $R_2$ is sufficiently elevated to hold the second switching transistor $Q_2$ off.

Finally, at the time $t_4$, the first input wave form A is up, and the second input wave form C is up. Under these conditions, both the control transistors $Q_3$ and $Q_4$ will be caused to conduct and therefore current will flow through both the resistances $R_3$, $R_4$ and the resistances $R_1$, $R_2$. Thus, both the base terminal leads 24 and 25 will be lowered in potential. However, the emitter terminals 17 and 18 will also be dropped in potential because of the current flow across the resistances $R_2$ and $R_4$, respectively, so that the difference between the base and emitter potentials of the transistors $Q_1$ and $Q_2$ will not change so that the transistors $Q_1$ and $Q_2$ will both be held open or off. Therefore, the voltage at the junction point E during time $t_4$ will be at its first voltage level as shown at F in the wave form E of FIGURE 2.

Summarizing the foregoing, when the polarity of the input wave forms A and C are the same as at the times $t_2$ and $t_4$, both the switching transistors $Q_1$ and $Q_2$ are held open or in a non-conducting state. When the polarities of the input wave forms A and C are unlike, as at the times $t_1$ or $t_3$, either one or the other of the transistors $Q_1$ and $Q_2$ will be caused to conduct as a consequence of a change in the control potential on its base through the action of one of the control transistors $Q_3$ or $Q_4$ so that a voltage will be developed across the resistance $R_5$ at the junction point E.

The time modulated signal or wave form E shown in FIGURE 2 and appearing at the junction point E in FIGURE 3 will be passed to the integrating circuit designated generally by the numeral 15 through conventional series connected coupling condenser 36 and resistance 37. As shown, the wave form passes directly to the base terminal 38 of a charge and discharge control transistor $Q_5$ of the NPN type having its emitter terminal 39 grounded as shown and its collector terminal 40 connected through resistance $R_8$ to B+. Connected across the base and collector terminals 38 and 40 is an integrating storage condenser 41 shunted by a relatively high resistance $R_9$. The output from the integrating circuit is taken at the point G in FIGURE 3 and is in the form of the wave form G depicted in FIGURE 2.

The operation of the integrating circuit is as follows: With the second voltage level provided on the base terminal 38 as at the time $t_1$ shown in FIGURE 2, for example, the transistor $Q_5$ is caused to conduct, thereby permitting any voltage across the storage condenser 41 to discharge through the collector terminal 40, transistor $Q_5$, and emitter terminal 39 to ground. When the voltage level on the base terminal 38 changes to the first voltage as at the time $t_2$ in FIGURE 2, the transistor $Q_5$ is cut off so that the condenser 41 will then commence charging from B+ voltage through the resistance $R_8$. The condenser 41 will continue to charge until the voltage wave form E again changes from its first voltage to its second voltage value as shown during the time interval at which the instant $t_3$ exists in FIGURE 2. The transistor $Q_5$ is thus turned on during the time interval that the second voltage exists at the base terminal 38 to permit discharging of the condenser 41 during this time. Charging of the condenser 41 will subsequently take place only after the second voltage at the base terminal 38 of the transistor $Q_5$ again changes to its first value as during the period of time at which the instant $t_4$ appears in FIGURE 2.

The actual charge and discharge curves define the output wave form G shown in FIGURE 2 when the paths are all connected. The result is a slowly varying output wave form in which the frequency $f_d$ exactly equals the difference in the frequencies $f_1$ and $f_2$ of the input wave forms.

The minute variations in the wave form G may be readily removed by simply providing a conventional smoothing circuit so that the output form will essentially constitute a sine wave of frequency corresponding to $f_d$.

Figure 4:
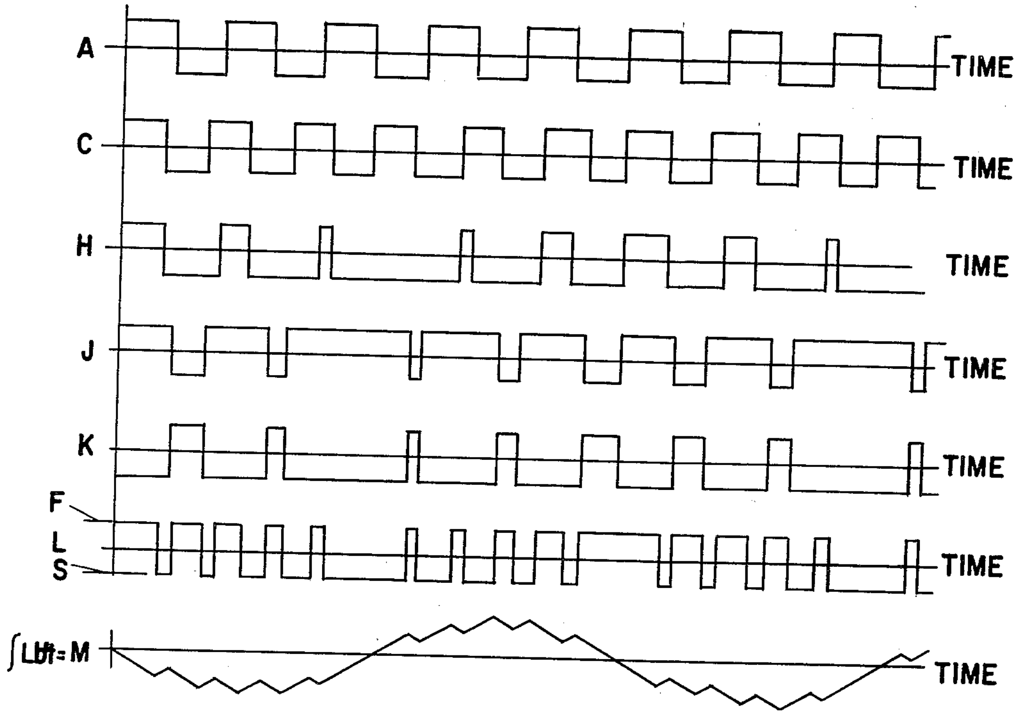
FIGURE 4 illustrates a series of lettered wave forms useful in explaining the operation of a second embodiment of the invention; and, FIGURE 5 is a detailed circuit diagram of the second embodiment of the invention.
Figure 5:
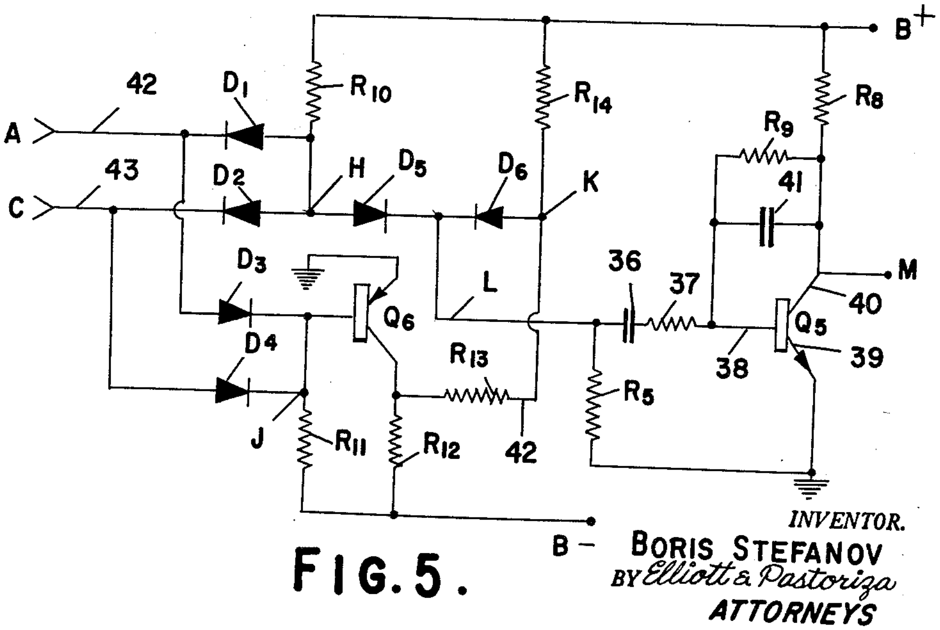

Referring now to FIGURES 4 and 5, there is illustrated a second embodiment of the invention in which diodes are employed in place of the control and switching transistors of FIGURE 3. Referring first to FIGURE 4, there are shown lettered wave forms which occur at the correspondingly lettered points in the circuit of FIGURE 5. As shown, the first and second input wave forms designated A and C are identical to the wave forms A and C shown in FIGURE 2. The third wave form H is up only when both A and C are up. The fourth wave form J is down only if both A and C are down. The wave form K is the same as wave form J with polarity inverted.

From the wave forms H and K, there is derived a time modulated signal L which is up when either H or K is up and down when H and K are both down. The signal L is the same as time modulated signal E of FIGURE 2 with polarity inverted. The first and second voltages F and S are therefore shown as inverted. From the time modulated signal L, there is derived the output frequency difference shown at M which is exactly the same as the frequency difference output signal G of FIGURE 2 except that its polarity is inverted.

The manner in which the above wave forms are derived will be evident by now referring to the circuit shown in FIGURE 5. Thus, the input wave forms A and C are received on lines 42 and 43 through reverse diodes $D_1$ and $D_2$ to a junction point at which the wave form H is generated. The B+ line connects through a resistance $R_{10}$ to the point H as shown.

The first and second input signals on lines 42 and 43 also connect through forward diodes $D_3$ and $D_4$ to a junction point at which the wave form J will appear. B− voltage connects to the junction point J through the resistance $R_{11}$.

Inversion of the wave form J of FIGURE 4 is accomplished by a simple inverting transistor $Q_6$ together with resistances $R_{12}$ and $R_{13}$ and line 42 to provide the wave form K at the junction point indicated by the letter K in FIGURE 5. Junction point K is supplied with B+ voltage through resistance $R_{14}$.

The junction points H and K in turn connect through forward diodes $D_5$ and $D_6$ to a center line L at which the time modulated wave form L of FIGURE 4 appears. This time modulated signal is then passed to the integrating circuit including the integrating transistor $Q_5$ and storage condenser 41, the operation and various elements making up the integrating circuit shown in FIGURE 5 being identical and designated by the same numerals and letters as the integrating circuit of FIGURE 3.

The operation of the circuit of FIGURE 5 to provide the various wave forms described in connection with FIGURE 4 will be evident from the foregoing description. Thus, when both the signals A and C are up, no conduction can occur from B+ through resistance $R_{10}$ and through the reverse diodes $D_1$ or $D_2$. On the other hand, if either the input signal A or the input signal C is down, one or the other of the diodes $D_1$ or $D_2$ can conduct, thereby causing a voltage drop across the resistance $R_{10}$ to cause the signal at H to be down. Therefore, when both A and C are up, the wave form H will be up, and when either one or the other is down, or if both are down, the wave form at H will be down. These conditions are shown for the wave form H in FIGURE 4.

The same input signals A and C are also applied to the forward diodes $D_3$ and $D_4$ to provide the wave form J at the junction point J. This wave form is down or at a low potential only when both wave forms A and C are down. Stated differently, if either or both wave form A or C is up, one or the other of the diodes $D_3$ or $D_4$ will conduct across the resistance $R_{11}$ to B−, thereby causing the wave form at the junction point J to be up. However, when both A and C are down, no conduction will take place across either diode $D_3$ or $D_4$, and therefore the wave form at the junction point J will be down or at B−.

As mentioned above, the transistor $Q_6$ will simply invert the wave form appearing at J, conduction on the transistor $Q_6$ occurring when J is down to cause junction point K to be up as the result of voltage drop across resistance $R_{12}$. Cutting off of the transistor when J is up results in the potential at the junction point K being down as a consequence of B−.

With the wave forms H and K provided at the opposite ends of the front-to-front diodes $D_5$ and $D_6$, it will be evident that the wave form on the line L as indicated by the wave form L in FIGURE 4 will be up when either one of the diodes $D_5$ or $D_6$ conducts since a voltage will be developed across the resistance $R_5$. On the other hand, the wave form L will be down only when both diodes $D_5$ and $D_6$ are non-conducting, that is, when H and K are both down. It is evident, accordingly, that the wave form L can only be down when both H and K are down and at all other times will be up.

Integration of the wave form L is exactly the same as integration of the wave form E of FIGURE 2, but because of the polarity inversion of the wave form L as compared to the wave form E of FIGURE 2, the output integrated curve M will be of opposite polarity to the output integrated curve G described in connection with FIGURE 2. However, the frequency of the output integrated wave form M will exactly correspond to the difference frequency of the input wave forms A and C.

In the circuit of FIGURE 5, the diodes $D_1$ and $D_2$ and $D_3$, $D_4$ perform functions similar to the first and second control transistor $Q_3$ and $Q_4$ of FIGURE 3 insofar as their state determines conductions of diodes $D_5$ and $D_6$. The diodes $D_5$ and $D_6$, on the other hand, serve similar functions to the first and second switching transistors $Q_1$ and $Q_2$ of FIGURE 3. Therefore, the diodes $D_1$, $D_2$, $D_3$, and $D_4$ together with transistor $Q_6$ may be identified as control means and the diodes $D_5$ and $D_6$ may be identified as switching means.

From the foregoing description, it will be evident that the present invention has provided extremely simple circuits for providing a difference frequency. Not only is the output signal limited to a single wave form having a difference frequency corresponding to the difference in the frequencies in first and second input signals, but in addition, there is no restriction on the actual difference frequency itself. In other words, by use of the integrating circuit, a D.C. output wave form could be provided if the difference frequency between the input wave forms corresponds to zero; that is, if the input wave forms had identically the same frequency.

While the various switching and control means have been effected through the use of transistors or diodes, it should be understood that any equivalent switching means including even mechanical relays could be employed although frequency limitations would be encountered with the use of mechanical relays in view of their relatively slow response time.

The present invention is therefore not to be thought of as limited to the specific embodiments set forth merely for illustrative purposes.

What is claimed is:

1. A circuit for providing an output wave form having a frequency equal to the difference in frequency between first and second input wave forms, including, in combination: square wave generating means connected to receive and convert said first and second input wave forms to first and second square wave forms; converting means connected to said square wave generating means to receive both said first and second square wave forms and responsive to said square wave forms when of like polarity for providing a first given voltage and when of unlike polarity for providing a second given voltage; and integrating means connected to said converting means to receive and integrate said first and second voltages to provide said output wave form, said converting means including a voltage source; first and second switching means having their inputs connected to said source and their outputs connected to said integrating means; and first and second control means connected to operate said first and second switching means, said first and second control means being respectively connected to receive said first and second square wave forms, one of said first and second given voltages being derived from said source at said integrating means when both of said switching means are open and the other of said first and second given voltages being derived from said source at said integrating means when either one of said switching means is closed, said first and second control means opening and closing said switching means in accordance with the relative polarities of said first and second wave forms, said first and second switching means comprising front-to-front diodes respectively with their common junction constituting said outputs connected to said integrating means and their backs constituting said inputs connected to said voltage source, said first and second control means comprising repectively, a first pair of reverse diodes having their fronts respectively connected to receive said first and second square wave forms and their backs connected to the input of said first switching means, and a second pair of forward diodes having their backs respectively connected to receive said first and second square wave forms; an inverting transistor having its input connected to the fronts of said forward diodes and its output connected to the output of said second switch means, said first given voltage being derived from said source at said integrating means when either one of said switching means is closed and said second given voltage being derived from said source at said integrating means when both of said switching means are open, said first and second control means closing one of said switching means when said first and second wave forms are of like polarity and opening both of said switching means when said first and second wave forms are of unlike polarity.

2. A circuit according to claim 1, in which said square wave generating means comprise overdriven amplifiers and said integrating means includes a storage condenser and a charging and discharging means connected to said condenser for changing the voltage across said condenser in one direction in response to the presence of said first voltage and changing the voltage across said condenser in an opposite direction in response to the presence of said second voltage, the amplitude of said output wave form varying in time in a manner corresponding to substantially the voltage variation in time across said condenser.

References Cited by the Examiner

UNITED STATES PATENTS

| | | | |
|---|---|---|---|
| 2,226,459 | 12/40 | Bingley | 328—28 XR |
| 2,529,564 | 11/50 | Miller | 329—106 XR |
| 2,877,416 | 3/59 | Grisdale | 307—88.5 |
| 2,963,648 | 12/60 | Baskin et al. | 324—89 XR |
| 2,988,695 | 6/61 | Leavitt | 324—89 XR |
| 2,989,652 | 6/61 | Hall | 307—88.5 |
| 3,021,481 | 2/62 | Kalmus et al. | 324—83 |

JOHN W. HUCKERT, *Primary Examiner.*

HERMAN KARL SAALBACH, ARTHUR GAUSS, *Examiners.*